United States Patent
Ferguson

(10) Patent No.: US 9,709,603 B2
(45) Date of Patent: Jul. 18, 2017

(54) CURRENT SENSING SYSTEM AND METHOD

(71) Applicant: Microsemi Corporation, Aliso Viejo, CA (US)

(72) Inventor: Bruce Ferguson, Anaheim, CA (US)

(73) Assignee: Microsemi Corporation, Aliso Viejo, CA (US)

( * ) Notice: Subject to any disclaimer, the term of this patent is extended or adjusted under 35 U.S.C. 154(b) by 239 days.

(21) Appl. No.: 14/666,326

(22) Filed: Mar. 24, 2015

(65) Prior Publication Data

US 2015/0276812 A1 Oct. 1, 2015

Related U.S. Application Data

(60) Provisional application No. 61/972,439, filed on Mar. 31, 2014.

(51) Int. Cl.
| | |
|---|---|
| *G01R 27/08* | (2006.01) |
| *G01R 27/26* | (2006.01) |
| *G01R 1/30* | (2006.01) |
| *G01R 19/00* | (2006.01) |
| *G05G 1/40* | (2008.04) |
| *H03F 3/45* | (2006.01) |
| *H03F 3/217* | (2006.01) |

(Continued)

(52) U.S. Cl.
CPC .......... *G01R 1/30* (2013.01); *G01R 19/0092* (2013.01); *H03F 3/217* (2013.01); *H03F 3/343* (2013.01); *H03F 3/68* (2013.01)

(58) Field of Classification Search
CPC .......... G01R 27/08; G01R 27/26; G01R 1/30; G01R 19/00; G05F 1/40; H03F 3/45

USPC ................ 324/123, 658, 709, 126; 323/282; 320/253, 255, 257, 260, 261, 273–274
See application file for complete search history.

(56) References Cited

U.S. PATENT DOCUMENTS

| | | |
|---|---|---|
| 4,267,517 A | 5/1981 | Iida |
| 5,936,468 A | 8/1999 | Wiese et al. |

(Continued)

OTHER PUBLICATIONS

International Search Report for PCT/US2015/022096 prepared by European Patent Office mailed Jul. 16, 2015.

(Continued)

*Primary Examiner* — Son Le
*Assistant Examiner* — Neel Shah
(74) *Attorney, Agent, or Firm* — Simon Kahn

(57) ABSTRACT

A current sensing system constituted of: an impedance element; a switching network arranged to alternately couple a first end of the impedance element between a supply voltage and return, the impedance element arranged to develop a voltage there across reflecting a current flow to a load coupled to the second end of the impedance element; a first stage amplifier, a first and second input thereof respectively coupled to the first and second end of the impedance element, a power supply input thereof coupled to a voltage greater than the supply voltage and a return thereof coupled to the first end of the impedance element, the amplifier having a first and second output, the potential difference reflecting the impedance element voltage times a first stage gain; and a second stage amplifier, a first and second input thereof respectively coupled to a first and second output of the first stage amplifier.

13 Claims, 2 Drawing Sheets

(51) Int. Cl.
H03F 3/343 (2006.01)
H03F 3/68 (2006.01)

(56) References Cited

U.S. PATENT DOCUMENTS

| | | | | |
|---|---|---|---|---|
| 6,707,339 | B1 * | 3/2004 | Kase | H03F 3/3023 330/255 |
| 7,102,365 | B1 * | 9/2006 | Atris | G01R 19/0023 324/658 |
| 2005/0285580 | A1 * | 12/2005 | Chen | H02M 3/156 323/282 |
| 2009/0251213 | A1 * | 10/2009 | Mangudi | G05F 3/205 330/253 |
| 2010/0231187 | A1 | 9/2010 | Wicht et al. | |
| 2012/0075022 | A1 * | 3/2012 | Lin | H03F 3/45183 330/253 |

OTHER PUBLICATIONS

Written Opinion of the International Searching Authority for PCT/US2015/022096 prepared by European Patent Office mailed Jul. 16, 2015.
International Rectifier Data Sheet No. PD60234 revB, IR22771S Phase Current Sensor IC for AC Motor Control; International Rectifier, El Segundo, California.
"Simple and Accurate High Side Current Sense Circuit"; Published Mar. 2013 by Intersil Americas LLC.
Si8540 Data Sheet—High-Side Current Sense Amplifier—Rev. 1.2, Mar. 2010, published by Silicon Laboratories, Inc., Austin, TX.
Arpit Mehta; "Understand Low-side vs. High-side Current Sensing"; published on Planet Analog—Feb. 13, 2009.

* cited by examiner

CURRENT SENSING SYSTEM AND METHOD

TECHNICAL FIELD

The invention relates generally to the field of current sensing, and in particular to a current sensing amplification system and method.

BACKGROUND

Current controlled electronic circuits are regulated by sensing a load current, comparing the sensed load current to a predetermined reference and adjusting the load current accordingly to match the predetermined reference. Typically, the current sensing is performed by providing a sense resistor within the load current path and sensing the voltage drop across the sense resistor generated by the load current flowing therethrough. This voltage drop is typically small to limit the power loss due to current sensing. For current sensing at the switch pin of a half bridge pulse width modulated (PWM) driver, the switch pin voltage changes from the high side rail to ground and back every switch cycle and so the voltage measured at the two terminals of the sense resistor has a very large common mode voltage due to the switch pin voltage changes and a relatively small differential voltage relating to the sense resistor voltage drop. In order to analyze the sense current, the differential voltage across the sense resistor must be extracted from the common mode voltage present equally at both ends of the sense resistor. Ideally, this would be accomplished with a differential amplifier exhibiting a very high common mode rejection ratio (CMRR).

Unfortunately, differential amplifiers designed to amplify a very small differential voltage with a very high common mode voltage present are difficult to implement. Therefore, the high common mode voltage, i.e. in excess of 50V, should be reduced using a voltage divider, while the small differential signal of a few hundred millivolts requires differential gain. Resistor mismatch in the differential voltage dividers and differential gain scaling resistors results in common mode signal amplification which must be minimized. This could be accomplished by providing extremely accurate resistors, however this significantly increases the cost of the amplifier.

SUMMARY OF THE INVENTION

Accordingly, it is a principal object of the present invention to overcome the disadvantages of prior current sensing systems. This is provided in one embodiment by a current sensing system comprising: a control circuitry; a switching network responsive to the control circuitry, a first end of the switching network coupled to a supply voltage and a second end of the switching network coupled to a supply voltage return; an impedance element, a first end of the impedance element coupled to the switching network, the switching network arranged to alternately couple the first end of the impedance element between the supply voltage and the supply return responsive to the control circuitry, the impedance element arranged to develop a voltage thereacross reflecting a current flow to a load coupled to the second end of the impedance element; a first stage amplifier exhibiting a predetermined first stage gain, a first input thereof coupled to the first end of the impedance element, a second input thereof coupled to a second end of the impedance element, a power supply input thereof coupled to a voltage greater than the supply voltage and return thereof coupled to the first end of the impedance element, the first stage amplifier having a first output and a second output, the potential difference between the first and the second output reflecting the voltage developed across the impedance element times the first stage gain; and a second stage amplifier exhibiting a predetermined second stage gain, a first input thereof coupled to a first output of the first stage amplifier and a second input thereof coupled to a second output of the first stage amplifier.

Additional features and advantages of the invention will become apparent from the following drawings and description.

BRIEF DESCRIPTION OF THE DRAWINGS

For a better understanding of the invention and to show how the same may be carried into effect, reference will now be made, purely by way of example, to the accompanying drawings in which like numerals designate corresponding elements or sections throughout.

With specific reference now to the drawings in detail, it is stressed that the particulars shown are by way of example and for purposes of illustrative discussion of the preferred embodiments of the present invention only, and are presented in the cause of providing what is believed to be the most useful and readily understood description of the principles and conceptual aspects of the invention. In this regard, no attempt is made to show structural details of the invention in more detail than is necessary for a fundamental understanding of the invention, the description taken with the drawings making apparent to those skilled in the art how the several forms of the invention may be embodied in practice. In the accompanying drawings.

DETAILED DESCRIPTION OF THE PREFERRED EMBODIMENTS

Figure 1:
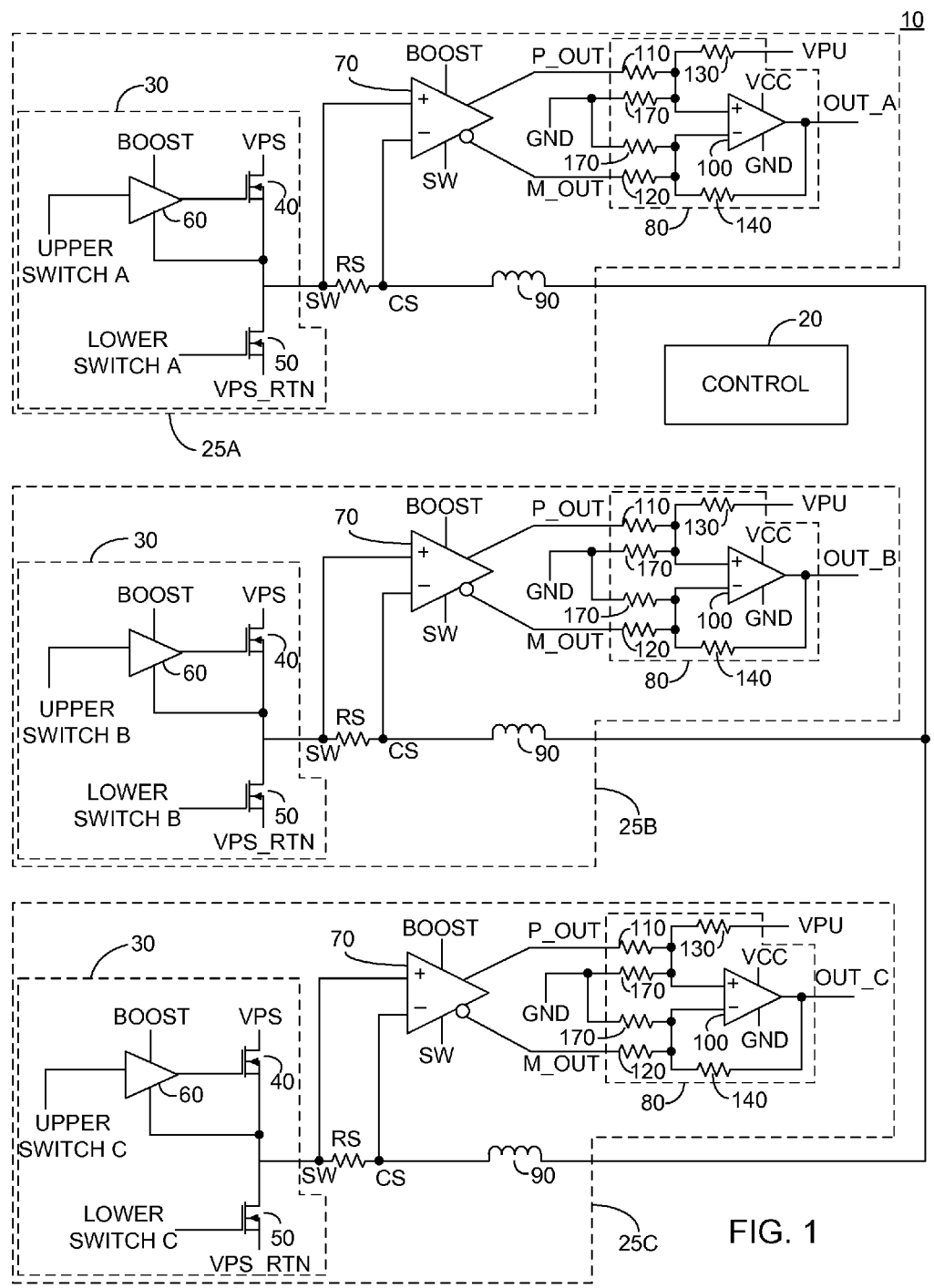
FIG. 1 illustrates a high level schematic diagram of a current sensing system comprising a first stage amplifier and a second stage amplifier, according to certain embodiments.

Before explaining at least one embodiment of the invention in detail, it is to be understood that the invention is not limited in its application to the details of construction and the arrangement of the components set forth in the following description or illustrated in the drawings. The invention is applicable to other embodiments or of being practiced or carried out in various ways. Also, it is to be understood that the phraseology and terminology employed herein is for the purpose of description and should not be regarded as limiting.

FIG. 1 illustrates a high level schematic diagram of a current sensing system 10 for a motor, current sensing system 10 comprising: a control circuitry 20; and three motor phase circuits, denoted 25A, 25B and 25C, respectively. Each of motor phase circuits 25A, 25B and 25C comprises: a switching network 30, comprising a first electronically controlled switch 40, a second electronically controlled switch 50 and an amplifier 60; an impedance element, in one embodiment comprising a sense resistor denoted RS; a first stage amplifier 70; a second stage amplifier 80; and a motor inductor 90. Second stage amplifier 80 comprises: an operational amplifier (op-amp) 100; a first input resistor 110;

a second input resistor 120; a first gain resistor 130; a second gain resistor 140; and a pair of resistors 170.

In one illustrated embodiment, first switch 40 and second switch 50 each comprise an n-channel metal-oxide-semiconductor field-effect transistor (NFET), however this is not meant to be limiting in any way and any other electronically controlled switches may be used without exceeding the scope. First stage amplifier 70 comprises a differential amplifier exhibiting a pair of differential inputs and a pair of differential outputs. In one embodiment, the resistance of first input resistor 110 is equal to the resistance of second input resistor 120, the resistance of first gain resistor 130 is equal to the resistance of second gain resistor 140 and the resistance of first resistor 170 is equal to the resistance of second resistor 170.

The arrangement of motor phase circuits 25A, 25B and 25C are in all respects similar to each other, thus for the sake of simplicity the component arrangement of motor phase circuits 25A, 25B and 25C are herein commonly described. The drain of NFET 40 is coupled to a supply voltage, denoted VPS, and the gate of NFET 40 is coupled to the output of amplifier 60. The source of NFET 40 is coupled to a first end of sense resistor RS, a non-inverting input of first stage amplifier 70, the supply return of first stage amplifier 70, the supply return of amplifier 60 and the drain of NFET 50, the node denoted SW. The supply rail of amplifier 60 is coupled to a voltage, denoted BOOST, which is greater than supply voltage VPS. In one non-limiting embodiment, voltage BOOST is 15V greater than supply voltage VPS. The input of amplifier 60 is coupled to a respective output of control circuitry 20 (coupling not shown), denoted UPPER SWITCH, and the gate of NFET 50 is coupled to a respective output of control circuitry 20 (coupling not shown), denoted LOWER SWITCH. The source of NFET 50 is coupled to a supply return potential, denoted VPS_RTN. A second end of sense resistor RS is coupled to an inverting input of first stage amplifier 70 and to a first end of motor inductor 90, the node denoted CS. The supply rail of first stage amplifier 70 is coupled to voltage BOOST.

A non-inverting output of first stage amplifier 70, denoted P_OUT, is coupled to a first end of first input resistor 110 and a second end of first input resistor 110 is coupled to the non-inverting input of op-amp 100, a first end of first gain resistor 130 and a first end of a first resistor 170. The supply rail of op-amp 100 is coupled to a level shift voltage, denoted VCC, which is less than supply voltage VPS and in one non-limiting embodiment is 5V. The supply return of op-amp 100 is coupled to a common potential, denoted GND. A second end of first gain resistor 130 is coupled to a pull-up voltage, denoted VPU, which exhibits a value which is between voltages VCC and GND, in non-limiting embodiment being 2.5V. An inverting output of first stage amplifier 70, denoted M_OUT, is coupled to a first end of second input resistor 120 and a second end of second input resistor 120 is coupled to the inverting input of op-amp 100, a first end of second gain resistor 140 and a first end of a second resistor 170. A second end of first resistor 170 and a second end of second resistor 170 are commonly coupled to common potential GND. A second end of second gain resistor 140 is coupled to the output of op-amp 100 and to a respective input of control circuitry 20, the output denoted OUT_A, OUT_B or OUT_C for each of motor phase circuits 25A, 25B and 25C, respectively. The second end of motor inductor 90 is coupled to the second end of motor inductors 90 of the others of motor phase circuits 25A, 25B and 25C.

The operation of motor phase circuits 25A, 25B and 25C are in all respects similar to each other and thus for the sake of simplicity are herein commonly described. In operation, control circuitry 20 is arranged to alternately output: a high output for signal UPPER SWITCH and a low output for signal LOWER SWITCH; and a low output for signal UPPER SWITCH and a high output for signal UPPER SWITCH.

When UPPER SWITCH is high, amplifier 60 is arranged to amplify the UPPER SWITCH signal to be on the order of voltage BOOST, which as described above is greater than supply voltage VPS, thereby closing NFET 40. As a result, the potential at node SW rises to supply voltage VPS and current flow through motor inductor 90 from the first end to the second end thereof, and this current flows through sense resistor RS from the first end to the second end thereof, thereby generating a voltage drop across sense resistor RS. The voltage differential between nodes SW and CS is detected by first stage amplifier 70. For a motor application, supply voltage VPS may rise up to 100 volts. In order to avoid producing excess heat and wasting energy, sense resistor RS is selected such that the voltage drop thereacross is several hundred millivolts, thereby an amplifier with a very high CMRR would generally be necessary in order to amplify the differential voltage to be greater than the common mode voltage so as to allow detection of the differential voltage. Advantageously, first stage amplifier 70 is referenced to node SW, and as a result no common mode voltage is detected by first stage amplifier 70 and only the differential voltage is amplified. This allows for a first stage amplifier 70 utilizing a relatively simple circuit with limited precision elements.

The differential voltage between outputs P_OUT and M_OUT of first stage amplifier 70 thus represents the differential voltage between the first and second ends of sense resistor RS times the open loop gain of first stage amplifier 70, which in one non-limiting embodiment is about 80. Since first stage amplifier 70 is referenced to the potential at node SW, the potential of each of outputs P_OUT and M_OUT are offset by the SW node potential, however the ratio between the differential voltage and the common mode voltage has increased by a factor equal to the open gain of first stage amplifier 70.

For example, in the event that the potential at node SW is 80V and the maximum voltage drop across sense resistor RS is 250 mV; in order for the common mode voltage to be less than 1% of the full scale differential voltage, the CMRR must be at least 80/0.0025, i.e. 32000, or 90 dB. If the first stage provides a differential gain of 80 and a common mode gain of 0, the first stage contributes a common mode rejection to the signal path equivalent to the differential gain, i.e. 38 dB. The CMRR required for the second stage differential amplifier is thus reduced to 90 db-38 dB, i.e. 52 dB. The use of a first stage of differential gain thus reduces the CMRR requirement of the differential amplifier, i.e. the first stage of differential gain reduces the CMRR requirement of the second stage.

Second stage amplifier 80 provides a level shift of the voltage differential between outputs P_OUT and M_OUT to within a predetermined voltage range. Second stage difference amplifier 80 attenuates the common mode signal to a level that is suitable for the common mode range thereof. The degree of mismatch between the resistance of first input resistor 110, second input resistor 120, first gain resistor 130, second gain resistor 140, first resistor 170 and second resistor 170 directly influences the common mode rejection. The differential amplification of second stage amplifier 80 is given as:

$$A_{DM} = \frac{R_{130}}{R_{110}} \qquad \text{EQ. 1}$$

where $A_{DM}$ is the differential amplification, $R_{130}$ is the resistance of first gain resistor 130 and $R_{110}$ is the resistance of first input resistor 110. The CMRR of second stage amplifier 80 is given as:

$$CMRR = \frac{\frac{1}{2} \times \left[ \frac{R_{130} \times R_{170p}}{R_{110} \times (R_{130} + R_{170p})} + \frac{R_{140} \times R_{170n}}{R_{120} \times (R_{140} + R_{170n})} \right]}{\frac{R_{130} \times R_{170p}}{R_{110} \times (R_{130} + R_{170p})} - \frac{R_{140} \times R_{170n}}{R_{120} \times (R_{140} + R_{170n})}} \qquad \text{EQ. 2}$$

where $R_{170p}$ is the resistance of first resistor 170, $R_{170n}$ is the resistance of second resistor 170, $R_{110}$ is the resistance of first input resistor 110, $R_{120}$ is the resistance of second input resistor 120, $R_{130}$ is the resistance of first gain resistor 130 and $R_{140}$ is the resistance of second gain resistor 140.

As described above, the resistance of first input resistor 110 is equal to the resistance of second input resistor 120, the resistance of first gain resistor 130 is equal to the resistance of second gain resistor 140 and the resistance of first resistor 170 is equal to the resistance of second resistor 170. However, the resistance equality is not exact and depends on the manufacturing precision of the resistors. For a CMRR of 90, second stage amplifier 80 would require 38 dB (two orders of magnitude) higher resistor matching precision than for a CMRR of 52. Thus, the addition of first stage amplifier 70, providing differential gain, reduces the precision requirement of the resistor matching in second stage amplifier 80.

When LOWER SWITCH is high, NFET 50 is closed. As a result, the potential at node SW falls to the supply return VPS_RTN value and current flows through motor inductor 90 towards supply return VPS_RTN thereby generating a voltage drop across sense resistor RS. The voltage differential between nodes SW and CS is detected by first stage amplifier 70 and amplifier thereby, and is further amplified by second stage amplifier 80, as described above.

Figure 2:
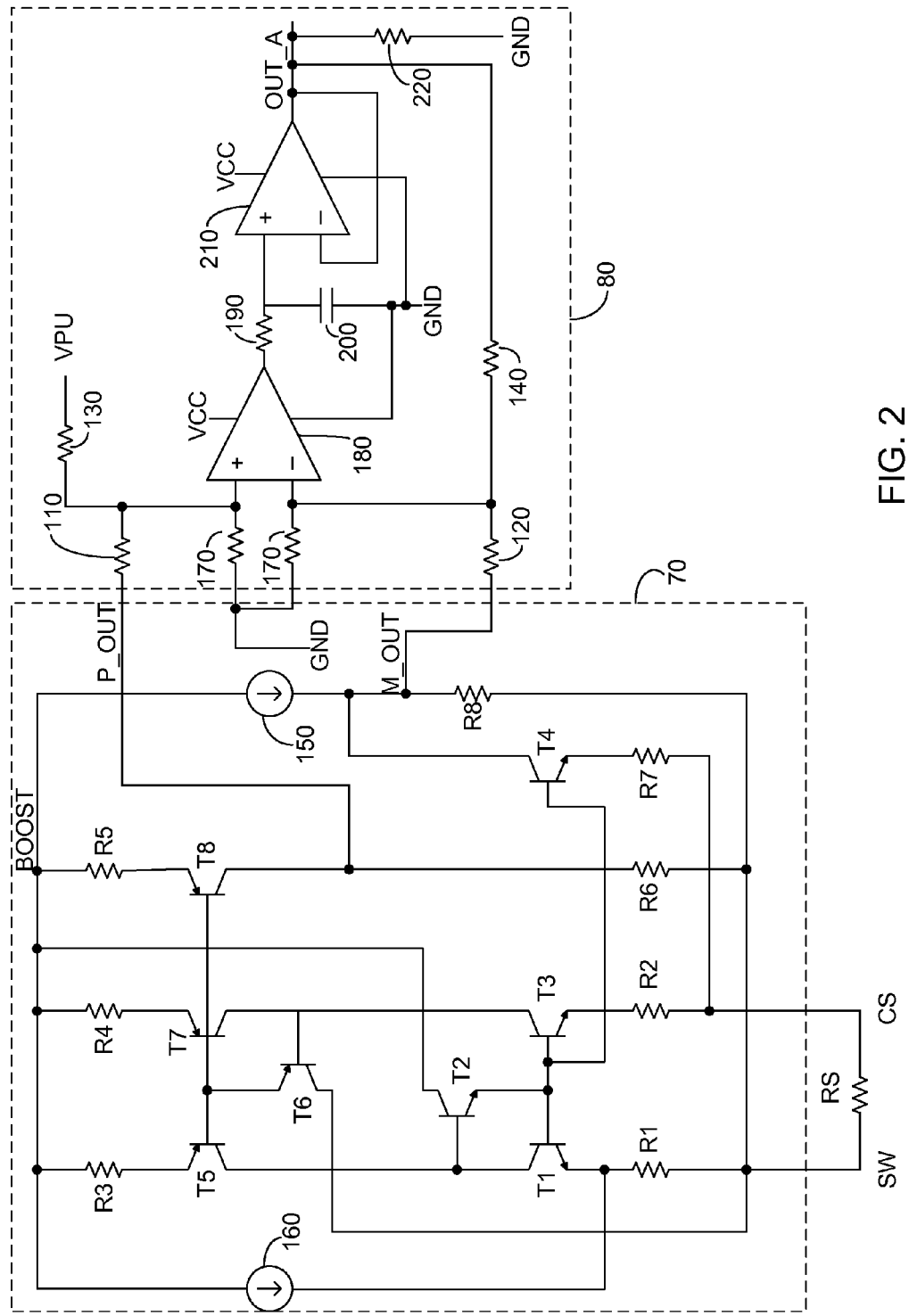
FIG. 2 illustrates a high level schematic diagram of the first stage amplifier and second stage amplifier of FIG. 1 according to certain embodiments.

FIG. 2 illustrates a high level schematic diagram of an embodiment of first stage amplifier 70 and second stage amplifier 80, according to certain embodiments. First stage amplifier 70 comprises: a plurality of NPN type bipolar junction transistors T1, T2, T3 and T4; a plurality of PNP type bipolar junction transistors T5, T6, T7 and T8; a plurality of resistors R1, R2, R3, R4, R5, R6, R7 and R8; and a pair of current sources 150 and 160. Second stage amplifier 80 comprises: op-amp 100; a first input resistor 110; a second input resistor 120; a first gain resistor 130; a second gain resistor 140; a pair of resistors 170; an RC network comprising a resistor 190 and a capacitor 200; a buffer 210; and an output resistor 220. In one embodiment, buffer 210 comprises an op-amp. First stage amplifier 70 is illustrated as comprising bipolar junction transistors, however this is not meant to be limiting in any way and metal-oxide-semiconductor field-effect-transistors (MOSFETs) may be used without exceeding the scope. In one embodiment, the resistance of resistors R3, R4 and R5 are equal. In another embodiment, the resistance of resistors R2 and R7 are equal. In one embodiment, the resistance of resistor R1 is half of the resistance of resistor R2 and current source 150 is arranged to generate a current exhibiting a magnitude 2 times greater than the magnitude of the current generated by current source 160. In another embodiment, the resistance of resistors R6 and R7 are equal and the resistance of first input resistor 110 and second input resistor 120 are equal.

A first end of resistor R1 is coupled to node SW and a second end of resistor R1 is coupled to the emitter of transistor T1. The base of transistor T1 is coupled to the emitter of transistor T2, the base of transistor T3 and the base of transistor T4. The collector of transistor T1 is coupled to the base of transistor T2 and the collector of transistor T5. The collector of transistor T2 is coupled to voltage BOOST. The emitter of transistor T3 is coupled to a first end of resistor R2 and a second end of resistor R2 is coupled to node CS. The collector of transistor T3 is coupled to the base of transistor T6 and the collector of transistor T7. The collector of transistor T6 is coupled to node SW. The emitter of transistor T6 is coupled to the bases of transistors T5, T7 and T8. The emitters of each of transistors T5, T7 and T8 are coupled to voltage BOOST, via a respective one of resistors R3, R4 and R5. A first end of resistor R6 is coupled to node SW and a second end of resistor R6 is coupled to the collector of transistor T8, the node comprising non-inverting output P_OUT of first stage amplifier 70. The emitter of transistor T4 is coupled to node CS via resistor R7. A first end of resistor R8 is coupled to node SW and a second end of resistor R8 is coupled to the collector of transistor T4, the node comprising inverting output M_OUT of first stage amplifier 70. The input of current source 150 is coupled to voltage BOOST and the output of current source 150 is coupled to the collector of transistor T4. The input of current source 160 is coupled to voltage BOOST and the output of current source 160 is coupled to the emitter of transistor T1.

Node P_OUT is coupled to a first end of first input resistor 110. A second end of first input resistor 110 is coupled to a first end of first gain resistor 130, a first end of a first resistor 170 and the non-inverting input of op-amp 100. A second end of first gain resistor 130 is coupled to pull-up voltage VPU, as described above. Node M_OUT is coupled to a first end of second input resistor 120. A second end of second input resistor 120 is coupled to a first end of second gain resistor 140, a first end of a second resistor 170 and the inverting input of op-amp 100. A second end of second gain resistor 140 is coupled to output OUT_A, as described above. The second ends of resistors 170 are commonly coupled to potential GND. The output of op-amp 100 is coupled to a first end of resistor 190 and a second end of resistor 190 is coupled to a first end of capacitor 200 and the non-inverting input of buffer 210. A second end of capacitor 200 and the inverting input of buffer 210 are each coupled to GND. The output of buffer 210 is coupled to a first end of output resistor 220 and to the inverting input of buffer 210, the node comprising output node OUT_A. A second end of output resistor 220 and the supply return of op-amp 100 are each coupled to potential GND. The supply rail of op-amp 100 is coupled to voltage VCC.

In operation, the voltage difference between node SW and node CS is amplified by the operation of transistors T1, T2, T3, T4, T5, T6, T7 and T8. In particular, transistor T5, T6, T7 and T8 form a current mirror, and in the embodiment where the resistance of resistors R3, R4 and R5 are equal the collector currents of transistors T5 and T8 equals the collector current in transistor T7. Transistors T1, T2, T3 and T4 form a current mirror, and in the embodiment, where the resistance of resistors R2 and R7 are equal the collector currents of transistors T3 and T4 are equal. The configuration of the two current mirrors forces a nearly equal collector current in transistors T1, T3, T4, T5, T7 and T8. The current in each these transistors is given as:

$$I_T = \frac{(I_{160} \times R_1) - (I_{SW} \times R_S)}{R_2 - R_1} \quad \text{EQ. 3}$$

where $I_{160}$ is the magnitude of the current output by current source 160, $R_1$ is the resistance of resistor R1, $I_{SW}$ is the magnitude of the current flowing through sense resistor RS, $R_S$ is the resistance of sense resistor RS and $R_2$ is the resistance of resistor R2. The biasing of current $I_{160}$ allows the dynamic voltage range of node CS to swing both above and below the SW node voltage so that current flowing through sense resistor RS in both directions can be sensed.

The differential output current, i.e. the difference between the collector currents of transistors T4 and T8 which having opposing equal currents, is $2 \times I_T$. The transfer function of the differential portion of the output current of first stage amplifier 70, where the output current is denoted $I_{OUT}$, is:

$$\frac{I_{OUT}}{I_{SW}} = \frac{2 \times R_S}{R_1 - R_2} \quad \text{EQ. 4}$$

The transfer function of the common mode portion of output current $I_{OUT}$, i.e. the portion generated by current source 160, is:

$$\frac{I_{OUT}}{I_{SW}} = 2 \times I_{160} \times \frac{R_1}{R_1 - R_2} \quad \text{EQ. 5}$$

where $I_{160}$ is the magnitude of the current generated by current source 160. The common mode portion of output current $I_{OUT}$ is compensated for by the current generated by current source 150, which in one embodiment is arranged to be 2 times the magnitude of current $I_{160}$ when the resistance of resistor R1 is half the resistance of resistor R2, as described above.

Thus, the voltage difference between nodes P_OUT and M_OUT is determined by the differential output current of first stage amplifier 70. As described above, in one embodiment, the resistance of resistors R6 and R7 are equal and the resistance of first input resistor 110 and second input resistor 120 are equal. Since op-amp 100 represents a virtual ground, the differential load impedance of first stage amplifier 70 is given as:

$$ROUT = R6 \| R100 + R8 \| R120 \quad \text{EQ. 6}$$

As described above, second stage amplifier 80 is arranged to amplify the differential voltage between nodes P_OUT and M_OUT and level shift the differential voltage to be between potentials VCC and GND, the amplification responsive to the resistance values of: first input resistor 110; second input resistor 120; first gain resistor 130; second gain resistor 140 and first and second resistors 170.

It is appreciated that certain features of the invention, which are, for clarity, described in the context of separate embodiments, may also be provided in combination in a single embodiment. Conversely, various features of the invention which are, for brevity, described in the context of a single embodiment, may also be provided separately or in any suitable sub-combination.

Unless otherwise defined, all technical and scientific terms used herein have the same meanings as are commonly understood by one of ordinary skill in the art to which this invention belongs. Although methods similar or equivalent to those described herein can be used in the practice or testing of the present invention, suitable methods are described herein.

All publications, patent applications, patents, and other references mentioned herein are incorporated by reference in their entirety. In case of conflict, the patent specification, including definitions, will prevail. In addition, the materials, methods, and examples are illustrative only and not intended to be limiting.

The terms "include", "comprise" and "have" and their conjugates as used herein mean "including but not necessarily limited to".

It will be appreciated by persons skilled in the art that the present invention is not limited to what has been particularly shown and described hereinabove. Rather the scope of the present invention is defined by the appended claims and includes both combinations and sub-combinations of the various features described hereinabove as well as variations and modifications thereof, which would occur to persons skilled in the art upon reading the foregoing description.

The invention claimed is:

1. A current sensing system comprising: a control circuitry; a switching network responsive to said control circuitry, a first end of said switching network coupled to a supply voltage and a second end of said switching network coupled to a supply voltage return;

an impedance element, a first end of said impedance element coupled to said switching network, said switching network arranged to alternately couple said first end of said impedance element between the supply voltage and the supply voltage return responsive to said control circuitry, said impedance element arranged to develop a voltage thereacross respectively reflecting a current flow to, and from, a load coupled to the second end of said impedance element;

a first stage amplifier exhibiting a predetermined first stage gain, a first input thereof coupled to said first end of said impedance element, a second input thereof coupled to a second end of said impedance element, a power supply input of said first stage amplifier coupled to a voltage greater than the supply voltage and the power supply return of said first stage amplifier coupled to said first end of said impedance element, said first stage amplifier having a first output and a second output, the potential difference between said first and second output reflecting the voltage developed across said impedance element times the first stage gain; and a second stage amplifier exhibiting a predetermined second stage gain, a first input thereof coupled to a first output of said first stage amplifier and a second input thereof coupled to a second output of said first stage amplifier, said second stage amplifier arranged to level shift the potential difference between said first and said second output of said first stage amplifier to be within a predetermined voltage range.

2. The system of claim 1, wherein said second stage amplifier has a single output, the potential at said single output reflecting the potential difference between said first and said second output of said first stage amplifier times the second stage gain.

3. The system of claim 1, wherein responsive to said switching network coupling said first end of said impedance element to the supply voltage, the load current flows from said first end of said impedance element to said second end thereof, and wherein responsive to said switching network coupling said first end of said impedance element to the supply voltage return, the load current flows from said second end of said impedance element to said first end thereof.

4. The system of claim 1, wherein said switching network comprises: a first electronically controlled switch, a first terminal thereof coupled to the supply voltage, said control circuitry arranged to apply a switching voltage to a control terminal of said first switch, the switching voltage greater than the supply voltage; and a second electronically controlled switch, a first terminal thereof coupled to a second terminal of said first switch and a second terminal thereof coupled to the supply voltage return, said first end of said impedance element coupled to said first terminal of said second switch, wherein said power supply input of said first stage amplifier is coupled to said switching voltage.

5. A current sensing method, the method comprising: alternately coupling a supply node between a supply voltage and a supply voltage return, the supply node in communication with a load; respectively providing a voltage representation of a current flow to the load and from the load, said voltage representation referenced to the supply node; amplifying said provided voltage representation by a first stage gain, said amplification performed by a first stage amplifier referenced to the supply node, said first stage amplified voltage representation presented across a first and second first stage amplification node; level shifting the first stage amplified voltage representation; amplifying said level shifted first stage amplified voltage representation by a second stage gain; and outputting said second stage amplified voltage representation.

6. The method of claim 5, wherein said level shifting of said first stage amplified voltage representation is to within a predetermined voltage range.

7. The method of claim 5, wherein responsive to said coupling to the supply voltage, said voltage representation exhibits a first direction, and wherein responsive to said coupling to the supply voltage return, said voltage representation exhibits a second direction, opposing said first direction.

8. The method of claim 5, wherein said provided voltage representation is generated across an impedance element, a first end of the impedance element coupled to the supply node, and wherein said voltage representation is amplified by said first stage gain responsive to an amplifier, a first input of the amplifier coupled to the first end of the impedance element, a second input of the amplifier coupled to a second end of the impedance element, a power supply input of the amplifier coupled to a voltage greater than the supply voltage, the return of the amplifier coupled to the supply node, and the first and second first stage amplification nodes comprising a first and second output of the amplifier.

9. A current sensing system comprising: a first stage amplifier exhibiting a predetermined first stage gain, a first input thereof coupled to said first end of an impedance dement, a second input thereof coupled to a second end of the impedance element, a power supply input of said first stage amplifier coupled to a voltage greater than a supply voltage and a power supply return of said first stage amplifier coupled to said first end of the impedance element, said first stage amplifier having a first output and a second output, the potential difference between said first and said second output reflecting the voltage developed across the impedance element times the first stage gain; and a second stage amplifier exhibiting a predetermined second stage gain, a first input thereof coupled to a first output of said first stage amplifier and a second input thereof coupled to a second output of said first stage amplifier, said second stage amplifier arranged to level shift the potential difference between said first and said second output of said first stage amplifier, wherein a first end of the impedance element is coupled to a switching network, a first end of the switching network coupled to a supply voltage and a second end of said switching network coupled to a supply voltage return, the switching network arranged to alternately couple the first end of the impedance element between the supply voltage and the supply voltage return responsive to a control circuitry, the impedance element arranged to develop a voltage thereacross respectively reflecting a current flow to and from a load coupled to the second end of the impedance element.

10. The system of claim 9, wherein said second stage amplifier is arranged to level shift the potential difference between said first and said second output of said first stage amplifier to be within a predetermined voltage range.

11. The system of claim 9, wherein said second stage amplifier has a single output, the potential at said single output reflecting the potential difference between said first and said second output of said first stage amplifier times the second stage gain.

12. The system of claim 9, wherein responsive to the switching network coupling the first end of said impedance element to the supply voltage, the load current flows from the first end of the impedance element to said second end thereof, and wherein responsive to the switching network coupling the first end of said impedance element to the supply voltage return, the load current flows from the second end of the impedance element to the first end thereof.

13. The system of claim 9, wherein the switching network comprises: a first electronically controlled switch, a first terminal thereof coupled to the supply voltage, the control circuitry arranged to apply a switching voltage to a control terminal of the first switch, the switching voltage greater than the supply voltage; and a second electronically controlled switch, a first terminal thereof coupled to a second terminal of the first switch and a second terminal thereof coupled to the supply voltage return, the first end of said impedance element coupled to the first terminal of the second switch, wherein said power supply input of said first stage amplifier is coupled to said switching voltage.

* * * * *